United States Patent [19]

Vaccaro et al.

[11] Patent Number: 5,639,673
[45] Date of Patent: Jun. 17, 1997

[54] TRANSPARENT OHMIC CONTACTS FOR SCHOTTKY DIODE OPTICAL DETECTORS ON THIN AND INVERTED EPITAXIAL LAYERS

[75] Inventors: Kenneth Vaccaro, Acton; Eric A. Martin, Medford, both of Mass.; Stephen M. Spaziani, Nashua, N.H.; Andrew Davis, Boston, Mass.

[73] Assignee: The United States of America as represented by the Secretary of the Air Force, Washington, D.C.

[21] Appl. No.: 486,442

[22] Filed: Jun. 8, 1995

[51] Int. Cl.⁶ .................................................. H01L 31/16
[52] U.S. Cl. ............................. 437/5; 437/3; 437/39; 437/176; 437/974
[58] Field of Search .......................... 437/3, 5, 39, 176, 437/175, 904, 974

[56] References Cited

U.S. PATENT DOCUMENTS

| | | |
|---|---|---|
| 5,053,843 | 10/1991 | Choudhury et al. |
| 5,470,761 | 11/1995 | McKee et al. ............ 437/5 |
| 5,472,914 | 12/1995 | Martin et al. ............ 437/974 |
| 5,494,833 | 2/1996 | Martin et al. ............ 437/3 |
| 5,532,173 | 7/1996 | Martin et al. ............ 437/3 |

Primary Examiner—Trung Dang
Attorney, Agent, or Firm—Robert L. Nathans

[57] ABSTRACT

An InP buffer layer is first formed upon an InP substrate; a thin layer of heavily doped InGaAs, a thick layer of light absorbing InGaAs, and a thin layer of InAlAs are thereafter sequentially grown upon the InP buffer layer. A light reflective Schottky barrier metallic layer is then applied to the InAlAs layer and the resulting device is inverted and affixed to a newly provided substrate, to thus shield and protect the sensitive Schottky contact. The InP substrate layers are thereafter removed and the now exposed thin, heavily doped InGaAs layer is coated with a transparent, electrically conductive layer of Indium-tin-oxide.

25 Claims, 1 Drawing Sheet

TRANSPARENT OHMIC CONTACTS FOR SCHOTTKY DIODE OPTICAL DETECTORS ON THIN AND INVERTED EPITAXIAL LAYERS

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of optical detectors.

The performance of a semiconductor optical detector is determined by complicated relations between the device design, material parameters, and processing capability. Although many designs are conceived, their implementations are hindered by lack of suitable fabrication procedures. It is desirable to provide for a simple fabrication procedure for producing a Schottky diode optical detector that maximizes conversion from optical power to electrical current without diminishing the response speed. Our new design reduces sources of noise current, maximizes the light sensitive area and employs a fabrication process without performance limiting complications.

InGaAs epitaxially grown on InP is a desirable choice for the light absorbing material, since this material strongly absorbs IR at 1.3 and 1.5 microns, for efficient use in communication applications. Fabrication of Schottky optical signal detectors requires the formation of high quality Schottky barriers providing low dark current and good sensitivity. This is not easily achieved on a low band-gap material such as InGaAs. A barrier-enhancing layer, such as InAlAs improves the Schottky contact, and thus the performance of such devices and thus should be included in the design of the IR optical detector. A fabrication process is desired which provides safety shielding of the sensitive front side Schottky contact, to protect it during further processing upon manufacture. Prior art metal-semiconductor-metal (MSM) detectors employ finger electrodes which block a significant fraction of incident light, decreasing the ultimate sensitivity of the detector. This problem is avoided if the device is illuminated through a transparent substrate or if the substrate is selectively removed. Hence, it is a further goal of the invention to provide a fabrication process for removing the InP substrates, initially required for good epitaxial growth of III-V layers grown thereon. This removal, along with providing transparent front ohmic contacts, simplifies alignment of light input sources illuminating the transparent ohmic contacts, such as optical fibers, to the light sensitive areas of the detector. Removal of the InP substrate also decreases the fraction of reflected radiation, which increases the detectors efficiency.

SUMMARY OF PREFERRED EMBODIMENTS OF THE INVENTION

The aforesaid goals are substantially met by the following fabrication method. An InP buffer layer is first formed upon an InP substrate; a thin layer of heavily doped InP, a thick layer of light absorbing InP, and a thin layer of InAlAs are sequentially grown upon the InP buffer layer. A light reflecting Schottky barrier metallic layer is then applied to the InAlAs layer and the resulting device is inverted and affixed to a newly provided substrate, to thus shield and protect the sensitive Schottky contact. The InP substrate layers are thereafter removed and the now exposed thin, heavily doped InGaAs layer is coated with a transparent, electrically conductive layer of Indium-tin-oxide.

BRIEF DESCRIPTION OF THE DRAWINGS

Figures one through six illustrate various steps in the method of fabricating the desired optical detector, such steps to be described in detail hereinbelow.

DETAILED DESCRIPTION OF AN EMBODIMENT OF THE INVENTION

Figure 1:
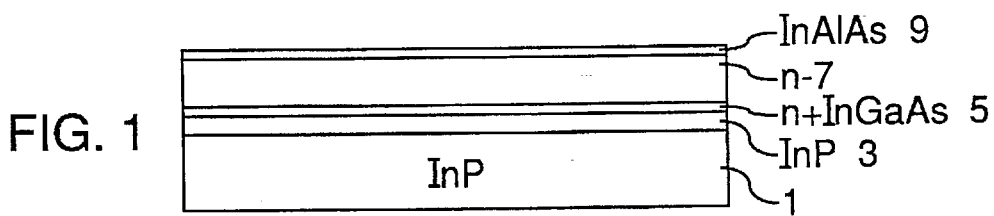
Figure 2:
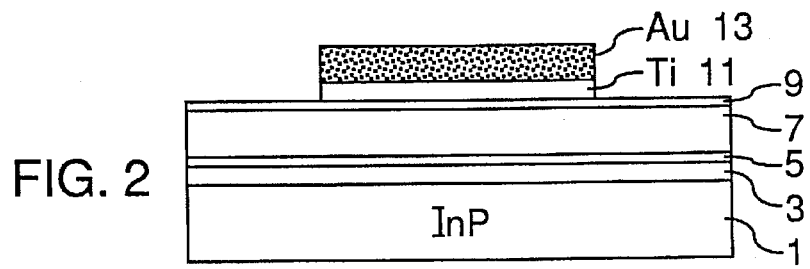

In FIG. 1, on a single InP semiconductor substrate 1, an epitaxial layer 3 of InP is first grown, which acts as a buffer to subsequently deposited epitaxial layers and promotes high quality growth. A relatively thin epitaxial layer 5 of InGaAs is now deposited which is about 25 nanometers thick and is heavily doped with donor atoms. A relatively thick epitaxial layer 7 is now deposited without any donor or acceptor atoms intentionally added, having a thickness of about 500 nanometers to insure that a large fraction of incident light is absorbed. A relatively thin 25 nanometer undoped epitaxial layer 9 of InAlAs is grown on top of layer 7, which insures a high quality Schottky Junction and low reverse-biased leakage currents. Schottky contact to layer 9 is formed with a 50 nanometer electrically conductive Ti layer 11, and a thicker conductive gold layer 13 is applied over layer 11, which lowers the series resistance of the Ti layer as shown in FIG. 2. Al is also a good choice for the layer 13.

Figure 3:
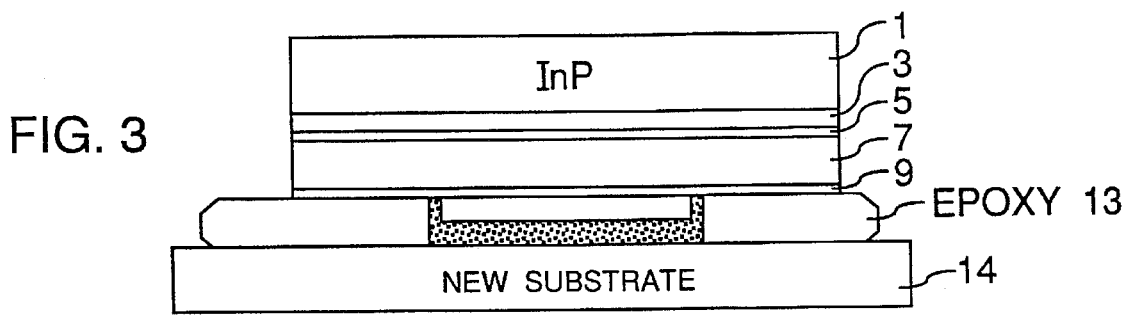
Figure 4:
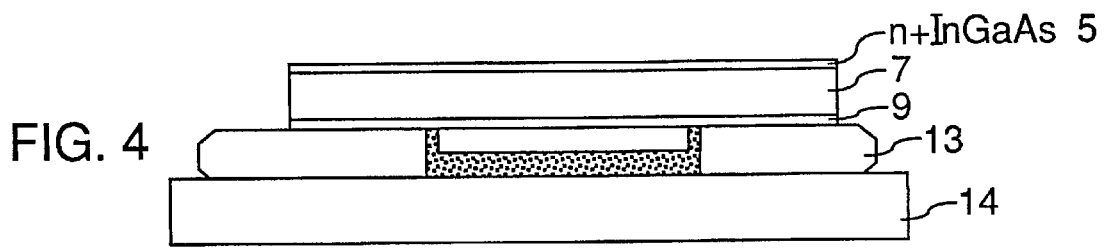
Figure 5:
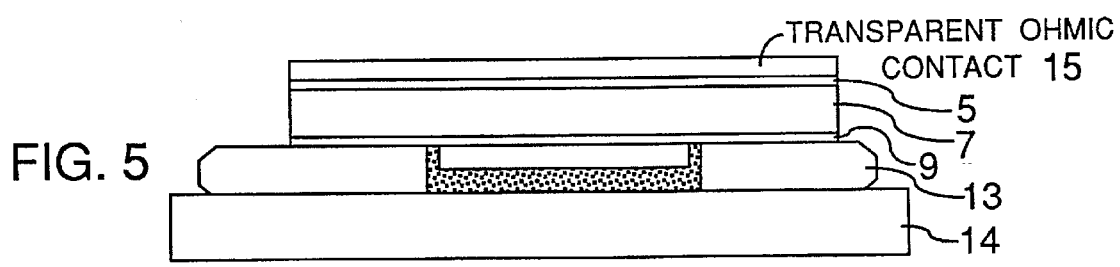

The Schottky contacts can be patterned with a lift-off process. The resulting wafer is inverted and is now fastened to a new substrate 14 by the application of epoxy 13, to protect the sensitive Schottky contact, as shown in FIG. 3. InP layers 1 and 3 are now removed as shown in FIG. 4, (using previously developed techniques; see for example, Air Force application Ser. No. 08/274,889, inventor Eric A. Martin, filed 14 Jul. 1994, entitled "BACKSIDE ELIMINATION MSM DEVICE AND METHOD",) and exposing the heavily doped epitaxial layer 5 of InGaAs, which is now coated with a transparent conductive coating of indium-tin-oxide, forming ohmic contact 15, shown in FIG. 5. Light directed at the front (top of FIG.) of the device will enter through this transparent coating 15, which should be of the appropriate thickness to reduce the reflection of incident light. Additionally, the Schottky barrier metal 11 is preferably highly reflective to thereby double the effective light absorbing length of the epitaxially grown light absorbing layer 7. Light not absorbed on the first pass through InGaAs layer 7 will thus undergo a second pass through layer 7. The transparent conductor 13 is patterned with a selective etching process to form mesa 20 as shown in FIG. 6, thus removing non-centralized portions of previously applied layers.

Figure 6:
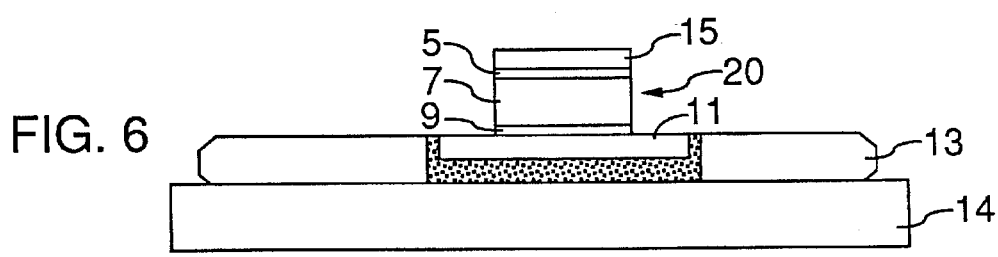

The FIG. 6 device could be duplicated to form a two dimensional array of thousands of detectors for sensing a light image focused by a lens upon thousands of transparent ohmic contact portions 15 lying atop mesas 20 in a planar array. Alternatively, a fiber optic strand could be positioned above an associated transparent ohmic contact portion 15. Alignment of such fiber optic strands will be greatly facilitated due to this contact transparency and the absence of the light attenuating substrates 1 and 3, which have been removed as explained hereinabove. The alignment between the front and back sides of the optical detector can be performed by an infrared alignment system or by techniques that expose selected areas of the previously deposited Schottky metal. If the heavily doped layer 5 is replaced with a lightly-doped layer, a lower quality Schottky contact results. The newly exposed front of the device opens a wide range of possible contact scenarios, while the sensitive Schottky contacts are safely sealed between the epitaxial layers and the new substrate 14.

Since variations in the above process will be readily apparent to those skilled in the art, the scope of the invention is to be defined by the terms of the following claims and art recognized equivalents thereof.

What is claimed is:

1. A method of fabricating an optical detector comprising:
    (a) forming an InP epitaxial buffer layer upon an InP substrate;
    (b) depositing a relatively thin epitaxial layer of heavily doped InGaAs upon said InP buffer layer;
    (c) depositing a relatively thick light absorbing InGaAs layer upon said layer of heavily doped InGaAs;
    (d) depositing a relatively thin InAlAs layer upon said relatively thick InGaAs layer;
    (e) depositing a Schottky barrier metallic layer over said InAlAs layer;
    (f) positioning said Schottky barrier metallic layer against a newly provided supportive substrate;
    (g) affixing the device fabricated in accordance with steps (a)–(e) to said supportive substrate;
    (h) removing said buffer layer and said InP substrate of step (a); and
    (i) forming a light transmissive electrode upon the InGaAs layer deposited in accordance with step (b).

2. The method of claim 1 wherein said Schottky barrier metallic layer comprises a highly reflective metal, thereby to increase the light absorption capability of said relatively thick InGaAs layer deposited in accordance with step (c).

3. The method of claim 1 including the step of removing non-centralized portions of the layers deposited in accordance with steps (a)–(d), thereby forming a mesa over the Schottky barrier metallic layer.

4. The method of claim 2 including the step of removing non-centralized portions of the layers deposited in accordance with steps (a)–(d), thereby forming a mesa over the Schottky barrier metallic layer.

5. The method of claim 1 wherein the layers deposited in accordance with steps (b) and (d) each have a thickness of about 25 nanometers and the layer deposited in accordance with step (c) has a thickness of about 500 nanometers.

6. The method of claim 2 wherein the layers deposited in accordance with steps (b) and (d) each have a thickness of about 25 nanometers and the layer deposited in accordance with step (c) has a thickness of about 500 nanometers.

7. The method of claim 3 wherein the layers deposited in accordance with steps (b) and (d) each have a thickness of about 25 nanometers and the layer deposited in accordance with step (c) has a thickness of about 500 nanometers.

8. The method of claim 4 wherein the layers deposited in accordance with steps (b) and (d) each have a thickness of about 25 nanometers and the layer deposited in accordance with step (c) has a thickness of about 500 nanometers.

9. The method of claim 1 wherein step (g) includes applying epoxy between the relatively thin InAlAs layer and the supportive substrate.

10. The method of claim 2 wherein step (g) includes applying epoxy between the relatively thin InAlAs layer and the supportive substrate.

11. The method of claim 3 wherein step (g) includes applying epoxy between the relatively thin InAlAs layer and the supportive substrate.

12. The method of claim 4 wherein step (g) includes applying epoxy between the relatively thin InAlAs layer and the supportive substrate.

13. A method of fabricating an optical detector comprising:
    (a) depositing a relatively thin epitaxial layer of InGaAs upon a first substrate;
    (b) depositing a relatively thick light absorbing InGaAs layer upon said relatively thin layer of InGaAs;
    (c) depositing a relatively thin InAlAs layer upon said relatively thick InGaAs layer;
    (d) depositing a Schottky barrier metallic layer over said InAlAs layer;
    (e) positioning said Schottky barrier metallic layer against a newly provided second substrate;
    (f) affixing the device fabricated in accordance with steps (a)–(d) to said second substrate;
    (g) removing said first substrate; and
    (h) forming a light transmissive electrode upon the InGaAs layer deposited in accordance with step (a).

14. The method of claim 13 wherein said Schottky barrier metallic layer comprises a highly reflective metal, thereby to increase the light absorption capability of said relatively thick InGaAs layer deposited in accordance with step (b).

15. The method of claim 13 including the step of removing non-centralized portions of the layers deposited in accordance with steps (a)–(c), thereby forming a mesa over the Schottky barrier metallic layer.

16. The method of claim 14 including the step of removing non-centralized portions of the layers deposited in accordance with steps (a)–(c), thereby forming a mesa over the Schottky barrier metallic layer.

17. The method of claim 13 wherein the layers deposited in accordance with steps (a) and (c) each have a thickness of about 25 nanometers and the layer deposited in accordance with step (b) has a thickness of about 500 nanometers.

18. The method of claim 14 wherein the layers deposited in accordance with steps (a) and (c) each have a thickness of about 25 nanometers and the layer deposited in accordance with step (b) has a thickness of about 500 nanometers.

19. The method of claim 15 wherein the layers deposited in accordance with steps (a) and (c) each have a thickness of about 25 nanometers and the layer deposited in accordance with step (b) has a thickness of about 500 nanometers.

20. The method of claim 16 wherein the layers deposited in accordance with steps (a) and (c) each have a thickness of about 25 nanometers and the layer deposited in accordance with step (b) has a thickness of about 500 nanometers.

21. The method of claim 13 wherein step (f) includes applying epoxy between the relatively thin InAlAs layer and the supportive substrate.

22. The method of claim 14 wherein step (f) includes applying epoxy between the relatively thin InAlAs layer and the supportive substrate.

23. The method of claim 17 wherein step (f) includes applying epoxy between the relatively thin InAlAs layer and the supportive substrate.

24. The method of claim 18 wherein step (f) includes applying epoxy between the relatively thin InAlAs layer and the supportive substrate.

25. A method of fabricating an optical detector comprising:
    (a) depositing a relatively thin epitaxial layer of InGaAs upon a first substrate;
    (b) depositing a relatively thick light absorbing InGaAs layer upon said relatively thin layer of InGaAs;

(c) depositing a Schottky barrier metallic layer over said relatively thick InGaAs layer;
(d) positioning said Schottky barrier metallic layer against a newly provided second substrate;
(e) affixing the device fabricated in accordance with steps (a)–(c) to said second substrate;
(f) removing said first substrate; and
(g) forming a light transmissive electrode upon the InGaAs layer deposited in accordance with step (a).

* * * * *